(12) United States Patent  
Hong et al.

(10) Patent No.: US 7,216,418 B2
(45) Date of Patent: *May 15, 2007

(54) METHOD FOR USING DIVIDER RODS FOR SEPARATING SUPERCONDUCTING REGIONS IN FINE FILAMENT INTERNAL TIN WIRE

(75) Inventors: Seung Hong, New Providence, NJ (US); Jeff Parrell, Roselle Park, NJ (US); Youzhu Zhang, East Brunswick, NJ (US); Michael Field, Jersey City, NJ (US)

(73) Assignee: Oxford Superconducting Technology, Carteret, NJ (US)

( * ) Notice: Subject to any disclaimer, the term of this patent is extended or adjusted under 35 U.S.C. 154(b) by 154 days.

This patent is subject to a terminal disclaimer.

(21) Appl. No.: 10/971,722

(22) Filed: Oct. 22, 2004

(65) Prior Publication Data

US 2006/0032042 A1   Feb. 16, 2006

Related U.S. Application Data

(60) Provisional application No. 60/513,640, filed on Oct. 23, 2003.

(51) Int. Cl.
*H01L 39/24* (2006.01)

(52) U.S. Cl. .................. 29/599; 29/825; 174/125.1; 505/928; 505/930

(58) Field of Classification Search .............. 29/599, 29/825, 868; 174/125.1; 148/95–98; 428/930; 505/230–234, 237, 928–930, 821
See application file for complete search history.

(56) References Cited

U.S. PATENT DOCUMENTS

| 4,084,989 | A | * | 4/1978 | Meyer .......................... 29/599 |
| 4,385,942 | A | | 5/1983 | Tachikawa et al. |
| 5,369,873 | A | * | 12/1994 | Walters et al. ................ 29/599 |
| 5,926,942 | A | * | 7/1999 | Kubo et al. ................... 29/599 |
| 6,810,276 | B1 | | 10/2004 | Zeitlin |
| 6,981,309 | B2 | * | 1/2006 | Hong et al. ................... 29/599 |

OTHER PUBLICATIONS

O. Kohno, Ti Added Nb3Sn Wires by New Fabrication Processes, IEEE Tranactions of Magnetics, vol. Mag 23, No. 2, Mar. 1987.

* cited by examiner

*Primary Examiner*—Minh Trinh
*Assistant Examiner*—Donghai D. Nguyen
(74) *Attorney, Agent, or Firm*—Klauber & Jackson

(57) ABSTRACT

A method for decreasing the effective magnetic filament sizes for high current internal tin $Nb_3Sn$ superconductors. During processing composite rods preferably comprised of copper clad Ta rods of approximately the same dimensions as the hexes in the designed filament billet stack are used as dividers in the subelement. Along with the Ta rods, Ta strips are strategically situated against the Nb or Nb alloy barrier tube which surrounds the subelement. The use of Ta as a spacer instead of copper prevents any reasonable likelihood of bridging of the superconducting phases formed after final reaction.

13 Claims, 5 Drawing Sheets a)

700μm b)

80μm

METHOD FOR USING DIVIDER RODS FOR SEPARATING SUPERCONDUCTING REGIONS IN FINE FILAMENT INTERNAL TIN WIRE

RELATED APPLICATION

This application claims priority from U.S. Provisional Patent Application No. 60/513,640, filed Oct. 23, 2003.

BACKGROUND OF THE INVENTION

The effective filament size of a $Nb_3Sn$ conductor in a high field magnet is an important parameter in reducing the magnetization hysteresis losses while charging and discharging the magnet and increasing the stability of said magnet. In a "low" current internal tin conductor (as used in fusion magnets), the individual filaments of a multifilamentary, multiple restacked billet are separated by copper far enough from each other that they do not bridge after reaction (reaction of Nb alloy filaments to A15 results in a volume expansion of ~30%), and the effective filament dimension is the size of the individual filaments. In a "high" current internal tin conductor, copper is minimized and so all the Nb filaments grow into each other, merging, and forming large rings of superconductor. In this case, the effective filament diameter ($d_{eff}$) is equal to that of the entire subelement instead of the individual filament. As will be further evident in the following, the term "subelement" refers to the subassembly which when tightly grouped (packed) with like subassemblies forms a precursor assembly for the final superconductor wire.

Some applications require both high current and small effective filament diameters. To date, there have been several basic approaches to decreasing the filament sizes for high current internal tin conductors. The first is to decrease the subelement size by either packing more subelements in a restack (lessening the ratio of the subelement size to wire diameter size) or drawing to a small wire diameter. The drawbacks of these approaches are as follows:

(1) Fabrication of a restack with a large number of small size subelements is difficult to accomplish. More subelements results in more surface area to keep clean and free of inclusions. This negatively affects wire piece length and yield.
(2) The use of wire drawn to a smaller size is only feasible if the end use application of the wire is flexible in that regard. Most of the time, an application (magnet design) requires wire of a specific strand diameter and hence the subelement size needs to be achieved for that diameter.
(3) The large amount of strain required to draw the individual subelements small can cause the filament components to work harden and thin to such an extent that they fail, resulting in wire breaks and poor piece length and yield.

A further prior art approach is to subdivide a subelement by copper spacers or bent plates of Ta40% Nb sheets. The problems with these prior art divider techniques are as follows:

(1) Copper spacers tend to deform to such an extent that the reacted sections bridge the copper separated section. In addition, the inclusion of these excess copper channels lowers the relative Sn to Cu ratio, which hinders A15 reaction and results in a lower current density. The ~30% volume expansion of Nb upon conversion to $Nb_3Sn$ also cause the filaments to grow across the copper spacers and merge.
(2) Ta40% Nb sheets, while not highly reactive, do react enough to form an A15 superconducting layer that causes some bridging problems.
(3) Ta40% Nb sheets prevent diffusion of the Sn across them, which inhibits uniform distribution of tin throughout the wire cross-section, resulting in non-optimal filament reaction and lower $J_c$.
(4) The use of sheets (e.g., Ta40% Nb) can cause yield/wire breakage problems because sheets are difficult to clean and inspect for flaws.
(5) Inserting tantalum, Ta40% Nb, or Cu sheets in the midst of a stack is difficult in the manufacturing process, disrupting the orderly stacking of the hexes.

SUMMARY OF INVENTION

The present invention overcomes the problems listed above, in part by using as dividers composite rods comprised of copper clad preferably Ta rods of approximately the same dimensions as the Nb filament hexes in the designed filament billet stack. Along with the Ta rods, Ta strips are strategically situated against the Nb or Nb alloy barrier tube. The strips are of dimensions such that the length is the same as the extrusion billet length, the width is sufficient that the reacted Nb alloy barrier beyond the plate does not bridge after reaction, and the thickness is sufficient to prevent Sn diffusion through the Ta layer in the final wire size. The use of Ta divider rods as separators instead of copper channels prevents any reasonable likelihood of bridging, as they will not be deformed like Cu during wire drawing and will not react appreciably to superconducting A15 phase like Ta40% Nb. The use of a combination of rods and strips instead of bent sheets aids in fabricability, as it is known that Ta or Ta40% Nb strips tend to break at any bend or discontinuity. The fact that the copper cladding of the Ta rods is at approximately the same ratio as the copper cladding of the Nb filaments that it divides means that Sn can diffuse between the dividers allowing for more uniform tin diffusion in all directions. The fact that the divider is a rod rather than a sheet results in easier inspection and cleaning of the divider, as rods are easily inspected by methods such as eddy current testing.

Thus in accordance with the present invention a method is disclosed for producing a multifilament $Nb_3Sn$ superconducting wire where the superconducting regions of the subelements are separated by divider rods and strips. This is accomplished by assembling a plurality of Nb or Nb alloy rods, separated by divider rods, within a copper containing matrix and within a Nb or Nb alloy diffusion barrier and copper can, with Ta strips being positioned between the diffusion barrier and divider rods. This forms the packed subelement for the superconducting wire. Critical is the packing of the divider rods amongst the Nb or Nb alloy rods in the copper containing matrix along with Ta divider strips to thereby divide the subelement into regions bounded by the rods and strips, with the divider strips further being positioned within the Nb or Nb alloy diffusion barrier which surrounds the subelement as to prevent the Nb barrier from reacting in the region directly behind the strips during a subsequent reaction diffusion step which forms the $Nb_3Sn$. There are also sources of Sn, which replace the center copper region during processing of the subelement and these subelements are assembled again within a further copper containing matrix. This final matrix is reduced to wire form, whereupon a reaction stage is undertaken to diffuse the said Sn into the Nb or Nb alloy rods to form $Nb_3Sn$ regions separated by the divider rods and strips.

BRIEF DESCRIPTION OF DRAWINGS

The invention is diagrammatically illustrated, by way of example, in the drawings appended hereto, in which.

DESCRIPTION OF PREFERRED EMBODIMENTS

Method of Processing

The fabrication of this type of conductor as is known in the art usually involves multiple extrusions where the product of the first extrusion is stacked into the second extrusion billet and so on.

First Extrusion

Figure 1:
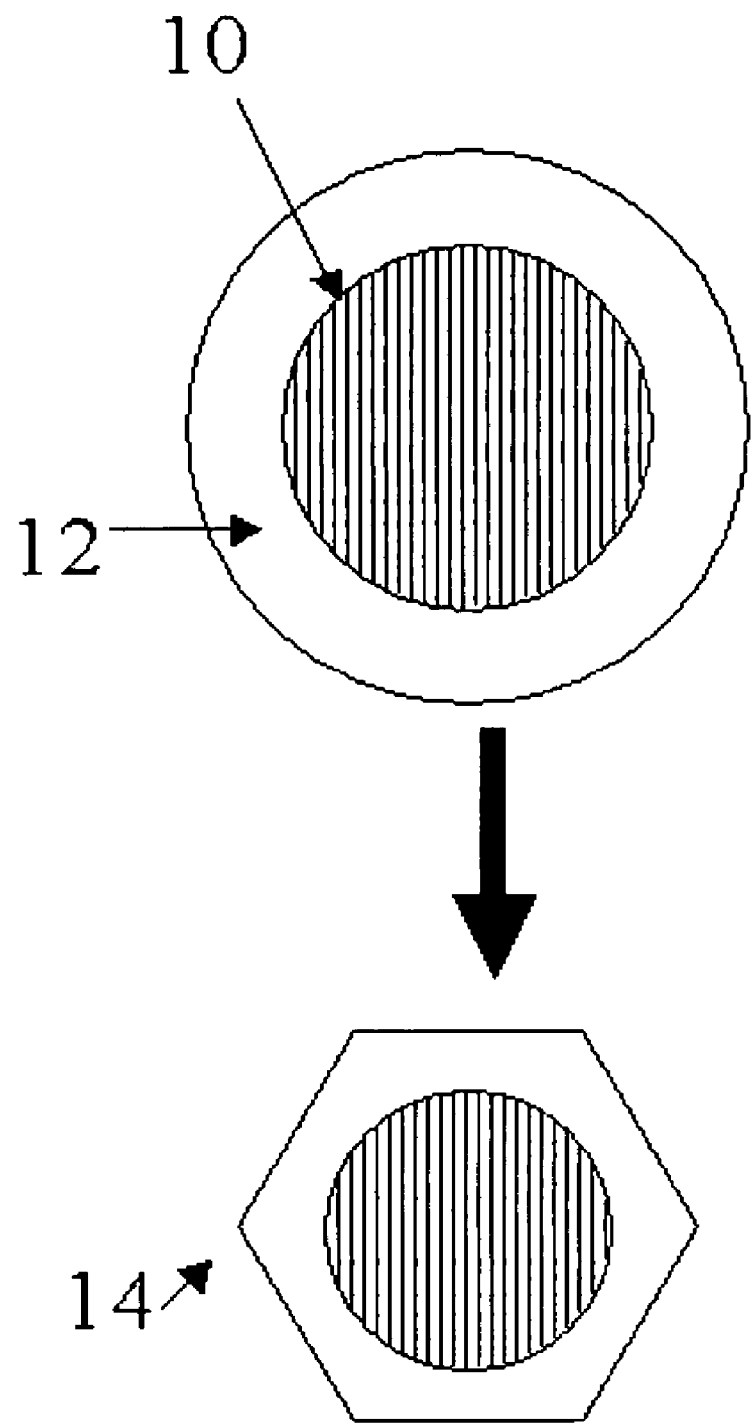
FIG. 1 is a schematic cross-sectional diagram illustrating the composition of the Nb alloy, for the monofilament.

Referring to FIG. 1 monofilament hexes of Nb (or Nb alloy) are manufactured by extruding a Nb ingot 10 in a copper can 12 and drawing the resulting rod to hex rods 14 for restacking. Alternatively, smaller diameter Nb rods could be wrapped with Cu foil to form the monofilament structure.

Second Extrusion

Figure 2:
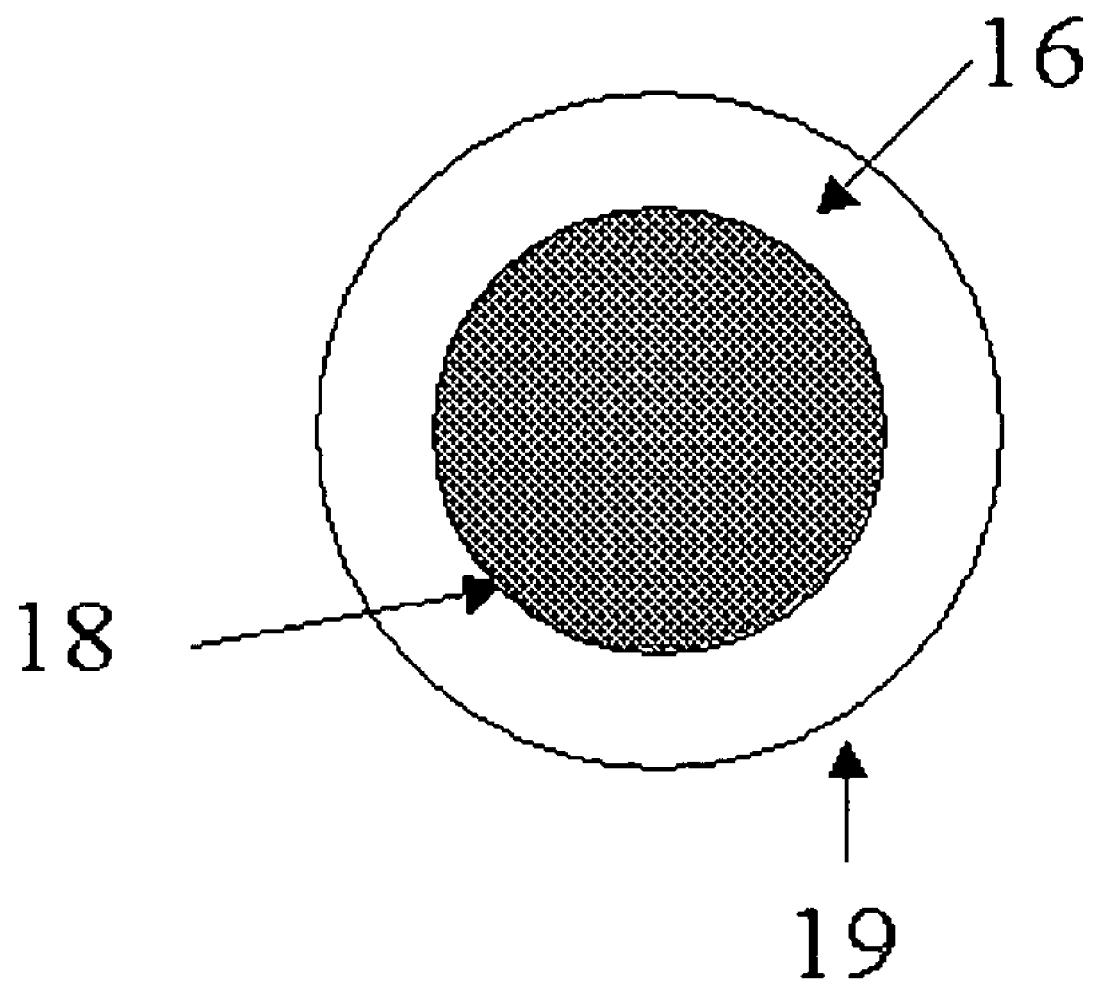
FIG. 2 is a schematic cross-sectional diagram of the Ta divider rods.
Figure 3:
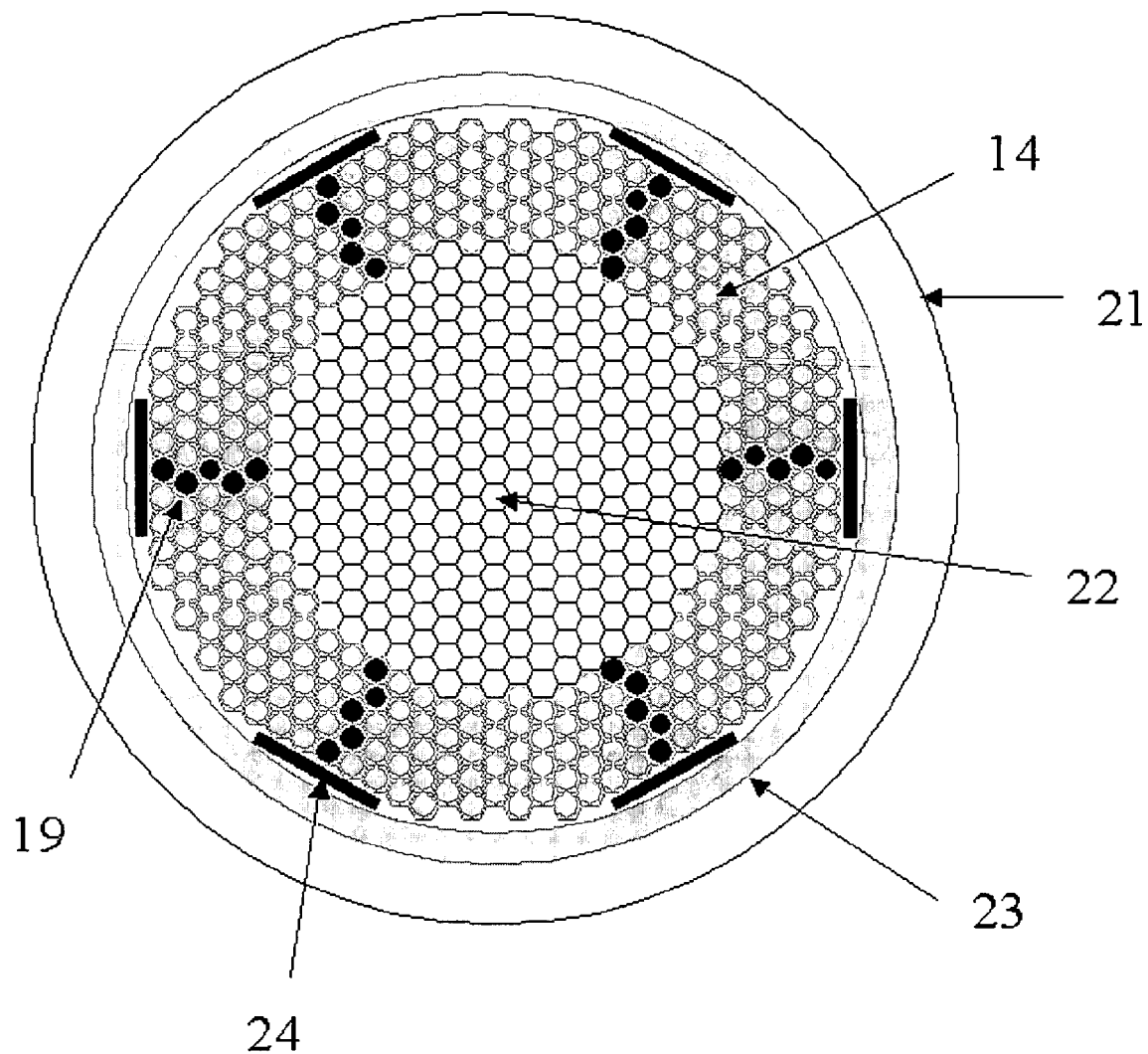
FIG. 3 is a schematic cross-sectional diagram of the second restack also known as the subelement.

Referring to FIG. 2, a Ta round rod 18 of similar dimension as the hexes in FIG. 1 are wrapped with Cu foil 16 of about 0.01" thick, to create a Ta—Cu unit 19 in preparation for packing in the subelement for second extrusion in FIG. 3. In FIG. 3, Cu hexes 22 are stacked in the center of the billet. These will eventually be drilled out and be replaced by tin post-extrusion. Typical dimensions of a hex rod are $\frac{1}{8}$" flat-to-flat by 2' in length. Nb—Cu hexes from the first extrusion 14 are then stacked around the copper hexes and inside a Nb alloy diffusion barrier 23 and a copper can 21. Selectively placed in the stack are the Ta—Cu hexes 19, placed in pattern so as to segment the Nb—Cu sections, which will expand and coalesce during the reaction stage. The pattern in FIG. 3 breaks the subelement into six sections, but this configuration can be used to make as few as two or more than 6 sections, depending on the size of the hexes and requirements of the designer. Tantalum strips 24 are located next to the Nb alloy barrier 23 as shown in FIG. 3, and serve to prevent the reaction of the barrier directly behind the row of dividers. Without this strip, the Nb alloy diffusion barrier would react enough to bridge all the superconducting sections that are otherwise separated by the Ta rods. This assembly is placed inside a copper can 21 that is evacuated, welded and extruded.

Third Extrusion or Drawing

The extruded rod from the second extrusion is packed in a copper can for a third hot extrusion or for cold processing. For the cold restack the rod from the second extrusion is straightened and gun-drilled through the center where the Cu hexes were originally stacked. The hole is packed with Sn (or a Sn alloy) and drawn to a hex for restacking again. This final restack is then cold drawn down to final wire size. For hot restacking, the extruded rods are drawn to hex, gun-drilled, packed with salt and extruded. The extruded rod then has the salt washed out and replaced with tin, and is then drawn to final size.

At final size, the wire can then be coiled into a magnet and heat-treated. The heat treatment needs to contain a reaction stage (600–725° C.) to form the superconducting $Nb_3Sn$. The Ta rods keep the $Nb_3Sn$ sections separate, and the Ta strips prevent reaction of the Nb barrier in the region where it would otherwise react and connect the sections.

It is understood that other copper clad rods can be substituted for the Ta rods 19 in FIG. 3. It is only necessary that the substituted rod be ductile, non-magnetic and not be superconducting under magnet operating conditions of temperature and magnetic field. An example of such a rod would be "poisoned" Nb rods, which are Nb rods alloyed by other elements intended to retard or otherwise hinder growth of superconducting $Nb_3Sn$ phase. Another example would be using a Ti alloy as dividers; unlike Ta the Ti divider rods would react, but since they react by exchanging Ti with Cu from the matrix, they result in a self-separating barrier. Cladding of the Ta rods can be achieved by wrapping the Ta rods with Cu foil, plating with Cu, or a copper clad composite can be made by extrusion of Ta ingot in a Cu can, or similar means.

In the example above the barrier rods were round. Other shapes such as hex rods can be used.

The invention is further illustrated by the following Examples, which are to be considered exemplary and not delimitive of the invention otherwise set forth:

EXAMPLE

First Extrusion

Monofilament hexes of Nb7.5 wt % Ta were made by extruding a Nb7.5 wt % Ta ingot in a copper can and drawing the resulting rod to hex rods 0.181" FTF X 1' for restacking.

Second Extrusion

Ta round rods 0.145" dia. were wrapped with Cu foil 0.01" thick, and placed in a subelement with the copper clad Nb7.5 wt % Ta rods from the first extrusion, copper hexes in the center, and a Nb7.5 wt % Ta diffusion barrier in a copper can as in a manner as previously illustrated in FIG. 3. This subelement was evacuated, welded, compacted and extruded from 6" to 2" diameter.

Cold Drawing of Final Restack

Figure 4:
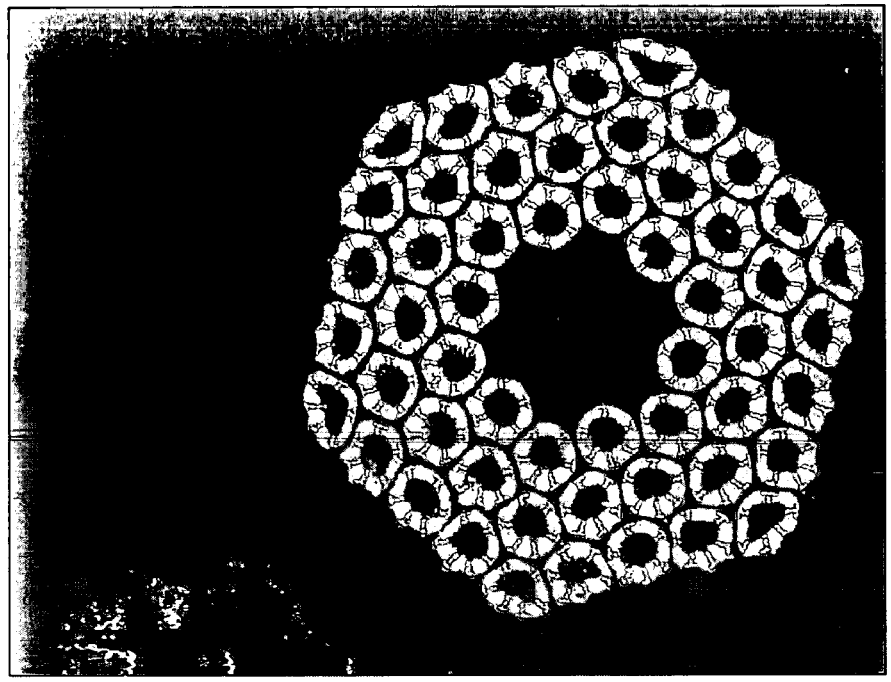
FIGS. 4a and 4b are SEM backscatter micrographs of a reacted cross section of Ta divided wire.
Figure 4:
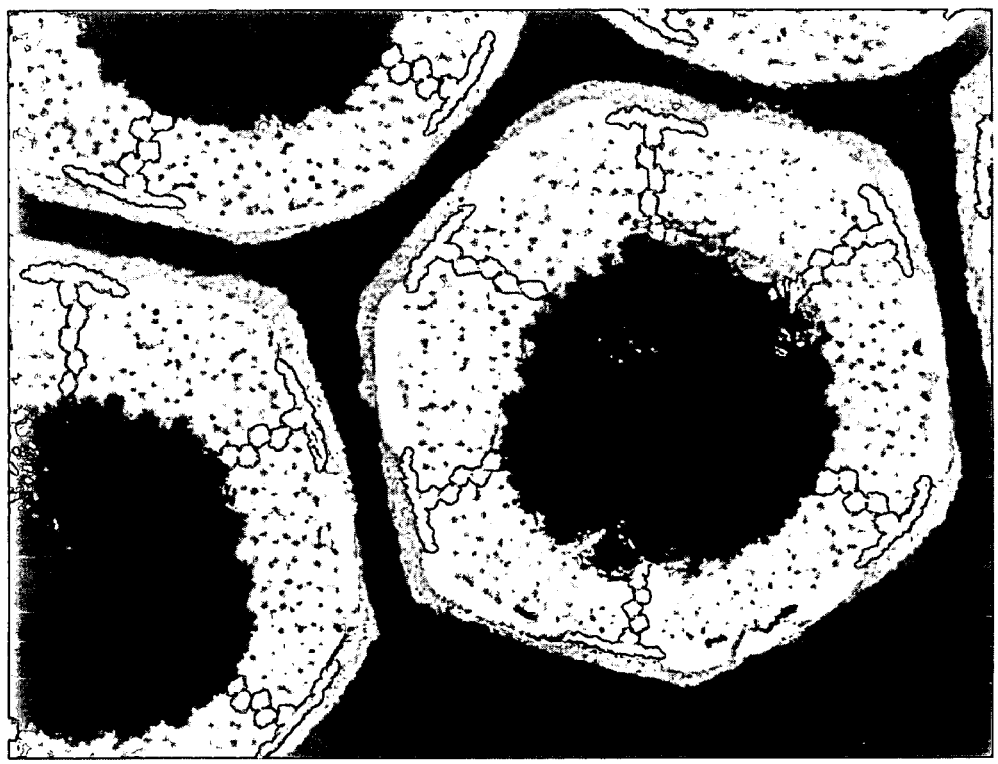

The 2" diameter rod was gundrilled and this hole was replaced with Sn alloy. The subelement was drawn to 0.173" FTF hex size, restacked, and drawn by cold drawing methods to a final size of 0.8 mm. In parallel, a control subelement and restack was made, which was constructed exactly as the divided billet except all Ta rods were replaced with standard Nb—Cu hexes and there were no Ta strips. The experimental and control final wires were reacted 48 hrs. at 210° C., 48 hrs. at 400° C., and then 180 hrs. at 675° C. A backscatter (atomic number) contrast image of the reacted wire cross section of the experimental wire is shown in FIG. 4. FIG. 4a shows the wire contains 54 subelements packed in a hexagonal pattern with copper in the center of the pattern. FIG. 4b details one of the subelements, and clearly shows the Ta areas in white as dividing the superconducting regions in light gray. The slightly darker regions of gray behind the Ta sheets are Nb7.5 wt % Ta and show the Nb7.5 wt % Ta barrier as unreacted in those regions as was desired.

TABLE 1 illustrates the effectiveness of the Ta dividers on the effective filament diameter of the cross section.

Figure 5:
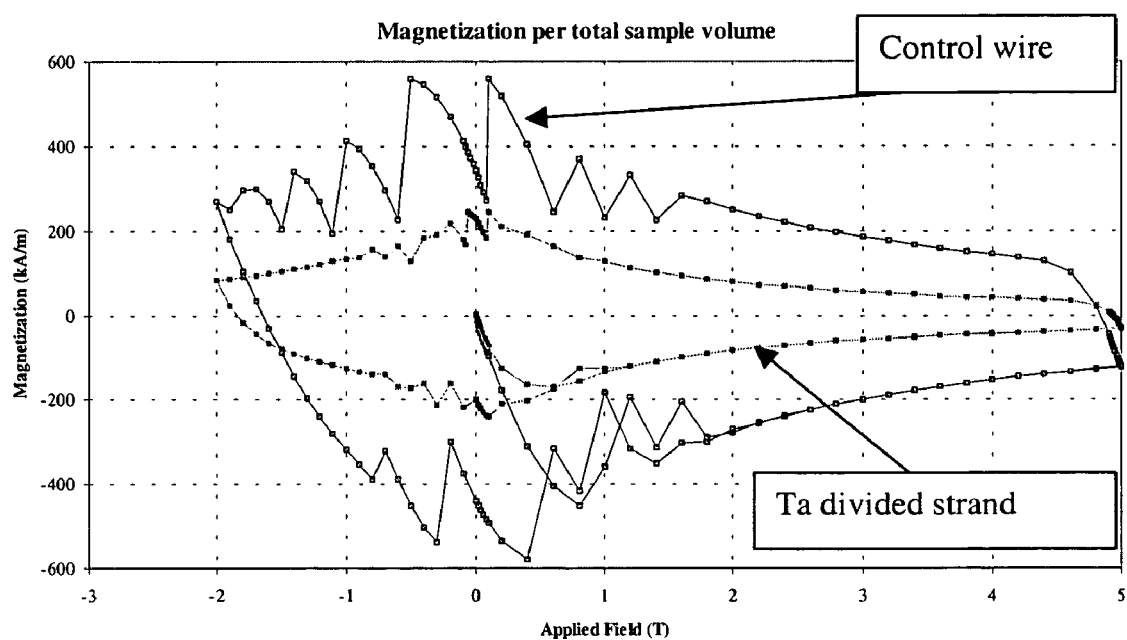
FIG. 5 is a plot of magnetization as a function of applied magnetic field showing the effect of the divided subelements versus a control wire with undivided subelements.

In Table 1, a numerical comparison thus appears for the experimental and control wires. Both were drawn to the same diameter and subjected to the same heat treatment. Because both were restacked in an identical manner, both had identical subelement diameters ($d_N$) of 88 µm. The critical current density was lower in the experimental wire, which was expected as the Ta regions needed to divide the subelement do not add to the current carrying capacity of the wire. The $d_{eff}$ was for the control wire was 99 µm, which is expected as the actual $d_{eff}$ is usually slightly larger than the $d_N$. The $d_{eff}$ was for the experimental wire was 42 µm, substantially lower than expected for a wire of these dimensions, and far less than the control wire, showing the efficacy of the technique. Also shown in FIG. 5 are magnetization hysteresis loops. The control wire shows a larger magnetization hysteresis loop and flux jump instabilities at low field, whereas the Ta divided strand has a smaller magnetization hystersis loop and no flux jump instabilities.

TABLE 1

|  | Dia.(mm) | $d_N$(µm) | $J_c$(12 T) A/mm² | $d_{eff}$ |
|---|---|---|---|---|
| Ta dividers | 0.8 | 88 | 2046 | 42 |
| No dividers (control) | 0.8 | 88 | 2491 | 99 |

While the present invention has been described in terms of specific embodiments thereof, it will be understood in view of the present disclosure, that numerous variations upon the invention are now enabled to those skilled in the art, which variations yet reside within the scope of the present teaching. Accordingly, the invention is to be broadly construed, and limited only by the scope and spirit of the claims now appended hereto.

The invention claimed is:

1. A method for producing a multifilament $Nb_3Sn$ superconducting wire comprising the steps of:
   a) packing a plurality of Nb or Nb alloy rods within a copper containing matrix to form a packed subelement for said superconducting wire;
   b) packing divider rods amongst the Nb or Nb alloy rods in the copper containing matrix along with Ta divider strips to thereby divide said subelement into regions bounded by said divider rods and strips; said divider strips further being positioned within a Nb or Nb alloy diffusion barrier which surrounds said subelement as to prevent the Nb or Nb alloy barrier from reacting during a subsequent diffusion step for forming said $Nb_3Sn$;
   c) providing sources of Sn within said subelement;
   d) assembling a plurality of said subelements within a further copper containing matrix;
   e) reducing said assemblage of step(d) to wire form; and
   f) diffusing the said Sn into the Nb or Nb alloy rods to form $Nb_3Sn$ regions separated by said divider rods and strips.

2. A method in accordance with claim 1 wherein in step a) said Nb or Nb alloy rods are ensheathed in a copper or copper alloy.

3. A method in accordance with claim 2, wherein the encased Nb or Nb alloy rods are formed into hexed cross sectioned rods for use in packing the subelement.

4. A method in accordance with claim 1, wherein said divider rods comprise Ta or Ta alloy rods in copper or copper alloy foils or sheaths.

5. A method in accordance with claim 4, wherein the Ta divider rods are formed into a hexagonal cross section to enable their packing among the hexed cross section Nb or Nb alloy rods.

6. A method in accordance with claim 4, wherein the Ta divider rods are formed into a round cross section.

7. A method in accordance with claim 4 wherein said Ta divider rods are strategically placed along with the Ta strips so as to subdivided the subelement into the desired number of sections.

8. A method in accordance with claim 1, wherein the Sn is diffused into said Nb or Nb alloy rods by an internal Sn process.

9. A method in accordance with claim 8, wherein the subelement from step (1d) is extruded gundrilled and the resulting holes filled with said Sn or Sn alloy.

10. A method in accordance with claim 8 wherein the subelements from step (1d) is extruded, gundrilled, filled with salt, restacked, extruded again, and the salt replaced with Sn or Sn alloy.

11. A method in accordance with claim 1, wherein said divider rods comprise Ti or Ti alloy rods in copper or copper alloy sheaths.

12. A method in accordance with claim 11, wherein the Ti or Ti alloy rods are placed in the subelement to separate superconducting regions to reduce the effective filament diameter and AC losses.

13. A method in accordance with claim 1, wherein in step (d) the subelements are hexed in cross-section.

* * * * *